United States Patent
Wang et al.

(10) Patent No.: US 12,002,874 B2
(45) Date of Patent: Jun. 4, 2024

(54) BURIED POWER RAIL CONTACT

(71) Applicant: International Business Machines Corporation, Armonk, NY (US)

(72) Inventors: Junli Wang, Slingerlands, NY (US); Ruilong Xie, Niskayuna, NY (US); Brent Anderson, Jericho, VT (US); Chen Zhang, Guilderland, NY (US); Heng Wu, Guilderland, NY (US)

(73) Assignee: International Business Machines Corporation, Armonk, NY (US)

( * ) Notice: Subject to any disclaimer, the term of this patent is extended or adjusted under 35 U.S.C. 154(b) by 205 days.

(21) Appl. No.: 17/384,908

(22) Filed: Jul. 26, 2021

(65) Prior Publication Data

US 2023/0022802 A1    Jan. 26, 2023

(51) Int. Cl.
    *H01L 29/66*      (2006.01)
    *H01L 21/8234*      (2006.01)
    *H01L 27/088*      (2006.01)
    *H01L 29/78*      (2006.01)

(52) U.S. Cl.
    CPC .......... *H01L 29/66795* (2013.01); *H01L 21/823431* (2013.01); *H01L 27/0886* (2013.01); *H01L 29/7851* (2013.01)

(58) Field of Classification Search
    CPC ..... H01L 21/823431; H01L 21/823487; H01L 21/78642; H01L 27/0886; H01L 29/66795; H01L 29/7851
See application file for complete search history.

(56) References Cited

U.S. PATENT DOCUMENTS

| | | | |
|---|---|---|---|
| 6,818,931 B2 | 11/2004 | Liu et al. | |
| 7,002,187 B1 | 2/2006 | Husher | |
| 7,821,039 B2 | 10/2010 | Tien et al. | |
| 8,946,914 B2 | 2/2015 | Stephens et al. | |
| 9,570,395 B1 | 2/2017 | Sengupta et al. | |
| 9,641,179 B2 * | 5/2017 | Masuoka | H01L 21/823885 |
| 10,103,247 B1 * | 10/2018 | Xie | H01L 29/665 |
| 10,586,765 B2 | 3/2020 | Smith et al. | |
| 2017/0352625 A1 * | 12/2017 | Leobandung | H01L 21/823475 |
| 2018/0374791 A1 * | 12/2018 | Smith | H01L 21/76224 |
| 2020/0266169 A1 | 8/2020 | Kang et al. | |
| 2020/0373331 A1 * | 11/2020 | Kim | H01L 27/1203 |

FOREIGN PATENT DOCUMENTS

EP      3454366 A1      3/2019

OTHER PUBLICATIONS

R. Mathur et al., "Buried Bitline for sub-5nm SRAM Design," 2020 IEEE International Electron Devices Meeting (IEDM), Dec. 12-18, 2020, 4 pages.

* cited by examiner

*Primary Examiner* — Tuan A Hoang
(74) *Attorney, Agent, or Firm* — Samuel Waldbaum; Ryan, Mason & Lewis, LLP

(57) ABSTRACT

A semiconductor structure includes a power rail contact at least partially disposed between a first source/drain region of a first vertical fin structure and a second source/drain region of a second vertical fin structure. The power rail contact is in contact with a buried power rail disposed under the first and second vertical fin structures. The power rail contact is in contact with at least one of the first and second source/drain regions. A contact cap is disposed above the power rail contact.

20 Claims, 16 Drawing Sheets

BURIED POWER RAIL CONTACT

BACKGROUND

This disclosure relates generally to semiconductor fabrication techniques and, in particular, to structures and methods for fabricating semiconductor structures and devices including, for example, vertical field-effect transistor (FET) devices.

Fin field-effect transistor (FinFET) devices include a transistor architecture that uses raised source-to-drain channel regions, referred to as fins. Known FinFET devices include fins with source/drain regions on lateral sides of the fins, so that current flows in a horizontal direction (e.g., parallel to a substrate) between source/drain regions at opposite ends of the fins in the horizontal direction. As horizontal devices are scaled down, there is reduced space for metal gate and source/drain contacts, which leads to degraded short-channel control and increased middle of the line (MOL) resistance.

Vertical field-effect transistors (VFETs) (also referred to as vertical transport field-effect transistors (VTFETs)) have become viable device options for scaling semiconductor devices (e.g., complementary metal oxide semiconductor (CMOS) devices) to 5 nanometer (nm) node and beyond. VFET devices include fin channels with source/drain regions at ends of the fin channels on top and bottom sides of the fins. Current flows through the fin channels in a vertical direction (e.g., perpendicular to a substrate), for example, from a bottom source/drain region to a top source/drain region. Vertical transport architecture devices are designed to address the limitations of horizontal device architectures in terms of, for example, density, performance, power consumption, and integration by, for example, decoupling gate length from the contact gate pitch, providing a FinFET-equivalent density at a larger contacted poly pitch (CPP), and providing lower MOL resistance.

SUMMARY

Embodiments comprise semiconductor devices and structures with buried power rails, as well as methods for fabricating semiconductor devices and structures with buried power rails.

According to an exemplary embodiment, a semiconductor structure includes a power rail contact disposed at least partially between a first source/drain region of a first vertical fin structure and a second source/drain region of a second vertical fin structure. The power rail contact is in contact with a buried power rail disposed under the first and second vertical fin structures. The power rail contact is in contact with at least one of the first and second source/drain regions. A contact cap is disposed above the power rail contact.

According to another exemplary embodiment, a semiconductor device includes a first vertical fin structure including a first source/drain region and a second vertical fin structure including a second source/drain region. The semiconductor device further includes a buried power rail disposed under the first and second vertical fin structures and a power rail contact disposed at least partially between the first and second source/drain regions and in contact with the buried power rail. The power rail contact is in contact with at least one of the first and second source/drain regions. A contact cap is disposed above the power rail contact.

According to yet another exemplary embodiment, a method for fabricating a semiconductor structure includes forming a power rail contact at least partially between a first source/drain region of a first vertical fin structure and a second source/drain region of a second vertical fin structure and in contact with a buried power rail disposed under the first and second vertical fin structures. The power rail contact is formed in contact with at least one of the first and second source/drain regions. The method further includes forming a contact cap above the power rail contact.

These and other exemplary embodiments will be described in or become apparent from the following detailed description of exemplary embodiments, which is to be read in connection with the accompanying drawings.

BRIEF DESCRIPTION OF THE DRAWINGS

Exemplary embodiments will be described below in more detail, with reference to the accompanying drawings, of which.

DETAILED DESCRIPTION

Figure 1:
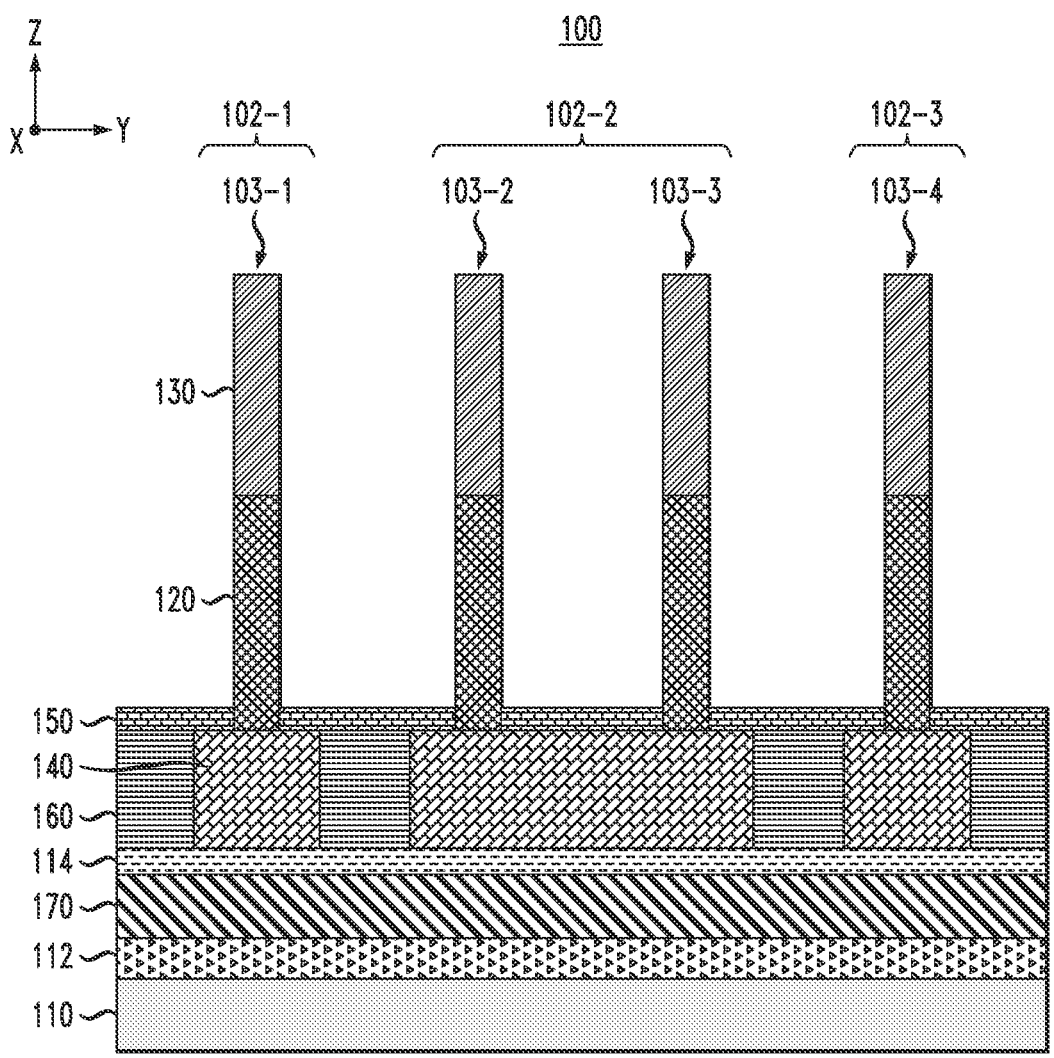
FIG. 1 is a cross-sectional view illustrating a substrate structure including vertical field-effect transistor (VFET) devices at an intermediate stage of fabrication, according to an exemplary embodiment.

Exemplary embodiments will now be discussed in further detail with regard to semiconductor devices and methods of manufacturing same and, in particular, to VFET devices with buried power rails.

It is to be understood that the various layers, structures, and regions shown in the accompanying drawings are schematic illustrations that are not drawn to scale. In addition, for ease of explanation, one or more layers, structures, and regions of a type commonly used to form semiconductor devices or structures may not be explicitly shown in a given drawing. This does not imply that any layers, structures, and regions not explicitly shown are omitted from the actual semiconductor structures.

Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, for example, wet cleaning and annealing steps, are purposefully not described herein for economy of description.

Moreover, the same or similar reference numbers are used throughout the drawings to denote the same or similar features, elements, or structures, and thus, a detailed explanation of the same or similar features, elements, or structures will not be repeated for each of the drawings. It is to be understood that the terms "about" or "substantially" as used herein with regard to thicknesses, widths, percentages, ranges, etc., are meant to denote being close or approximate to, but not exactly. For example, the term "about" or "substantially" as used herein implies that a small margin of error is present, such as 1% or less than the stated amount.

To provide spatial context, illustrative XYZ Cartesian coordinates are shown in the drawings of semiconductor device structures. It is to be understood that the term "vertical" as used herein denotes a Z-direction of the Cartesian coordinates shown in the drawings, and that the terms "horizontal" or "lateral" as used herein denote an X-direction and/or a Y-direction of the Cartesian coordinates shown in the drawings, which is perpendicular to the Z-direction.

As used herein, "height" refers to a vertical size of an element (e.g., a layer, trench, hole, opening, etc.) in the cross-sectional views measured from a bottom surface to a top surface of the element in the Z-direction, and/or measured with respect to a surface on which the element is located. Conversely, a "depth" refers to a vertical size of an element (e.g., a layer, trench, hole, opening, etc.) in the cross-sectional views measured from a top surface to a bottom surface of the element in the Z-direction. Terms such as "thick", "thickness", "thin" or derivatives thereof may be used in place of "height" where indicated.

As used herein, "lateral," "lateral side," "lateral surface" refers to a side surface of an element (e.g., a layer, opening, etc.), such as a left or right-side surface in the drawings.

As used herein, "width" or "length" refers to a size of an element (e.g., a layer, trench, hole, opening, etc.) in the drawings measured from a side surface to an opposite surface of the element. Terms such as "thick", "thickness", "thin" or derivatives thereof may be used in place of "width" or "length" where indicated.

As used herein, terms such as "upper", "lower", "right", "left", "vertical", "horizontal", "top", "bottom", and derivatives thereof shall relate to the disclosed structures and methods, as oriented in the drawing figures. For example, as used herein, "vertical" refers to a direction perpendicular to the top surface of the substrate in the cross-sectional views, i.e., the Z-direction, and "horizontal" refers to a direction parallel to the top surface of the substrate in the cross-sectional views.

As used herein, unless otherwise specified, terms such as "on", "overlying", "atop", "on top", "positioned on" or "positioned atop" mean that a first element is present on a second element, wherein intervening elements may be present between the first element and the second element. As used herein, unless otherwise specified, the term "directly" used in connection with the terms "on", "overlying", "atop", "on top", "positioned on" or "positioned atop" or the term "direct contact" mean that a first element and a second element are connected without any intervening elements, such as, for example, intermediary conducting, insulating or semiconductor layers, present between the first element and the second element.

The cross-sections in FIGS. 1-16 are taken perpendicular to the length of the fins along the substrate during various stages of fabrication.

FIG. 1 is a cross-sectional view of a semiconductor structure 100 of a VFET semiconductor device at an intermediate stage of fabrication prior to the formation of a gate. As shown in FIG. 1, the semiconductor structure 100 includes three VFET devices 102-1, 102-2 and 102-3 collectively and individually referred to herein as VFET devices 102. Each VFET device 102 includes one or more vertical FIN structures. For example, the VFET device 102-1 is a single-fin device comprising FIN structure 103-1, the VFET device 102-2 is a two-fin device comprising FIN structures 103-2 and 103-3, and VFET device 102-3 is a single-fin device comprising FIN structure 103-4. FIN structures 103-1, 103-2, 103-3 and 103-4 are also collectively and individually referred to herein as FIN structures 103. While illustrated as having three VFET devices 102, any other number of VFET devices 102 with any other number of FIN structures 103 may be included in the semiconductor structure 100. Each of the FIN structures 103 is formed from a plurality of layers including, for example, a fin 120, a fin hardmask 130, a bottom source/drain region 140, a bottom spacer 150, a shallow trench isolation (STI) layer 160, a semiconductor substrate 114, buried power rail (BPR) 170 and ILD 112 that are sequentially formed on a semiconductor substrate 110, according to an exemplary embodiment.

The BPR 170 is embedded in the semiconductor substrate 110 below the bottom source/drain region 140 of at least some of the VFET devices 102. BPR 170 may comprise a metal-based material such as, e.g., tungsten, cobalt, zirconium, tantalum, titanium, aluminum, ruthenium, and/or copper. In some embodiments, the BPR 170 is formed over the semiconductor substrate 110, for example, by a process including depositing ILD 112 on the semiconductor substrate 110, patterning BPR trenches in the ILD 112, performing a BPR metal fill and CMP and forming an Si substrate over the BPR 170 through a dielectric bonding process such as, e.g., oxide-oxide bonding. The Si substrate is thinned down to form semiconductor substrate 114 and the FIN structures 103 of the VFET devices 102 are formed on the semiconductor substrate 114 over the BPR 170.

In some embodiments, each semiconductor substrate 110 and 114 includes semiconductor material including, but not limited to, silicon (Si), silicon germanium (SiGe), silicon carbide (SiC), carbon doped silicon (Si:C), silicon germanium carbide (SiGeC), carbon doped silicon germanium (SiGe:C), a group III-V, II-VI compound semiconductor material or other semiconductor material. In addition, multiple layers of the semiconductor materials can be used as the semiconductor material of the substrate. The semiconductor substrates 110 and 114 can be bulk substrates or semiconductor-on-insulator substrates such as, but not limited to, a silicon-on-insulator (SOI), silicon-germanium-on-insulator (SGOI) or group III-V-on-insulator substrate including a buried insulating layer, such as, for example, a buried oxide, nitride layer or aluminum oxide.

Fins 120 may be formed, for example, by patterning a semiconductor layer. The semiconductor layer may include, but is not necessarily limited to, Si, SiGe or group III-V materials, and may be epitaxially grown. According to an embodiment, a fin hardmask 130 including, for example, a dielectric material, such as silicon nitride (SiN), is formed on portions of the semiconductor layer that are to be formed into the fins 120. The fin patterning can be done by a combination of various patterning techniques, including, but not necessarily limited to, for example, a lithography process such as, e.g., extreme ultraviolet (EUV) lithography, 193 nm optical lithography, nanoimprint lithography, or other lithographic processes, and a directional etching process such as, e.g., a reactive ion etch (RIE), a sidewall image transfer (SIT) process such as self-aligned double patterning (SADP), self-aligned multiple patterning (SAMP), self-aligned quadruple patterning (SAQP), or combinations thereof. While embodiments describe channel regions as fins, the embodiments are not necessarily limited to fin channel regions, and may include nanowire channel regions.

With continued reference to FIG. 1, in an exemplary embodiment, bottom source/drain region 140, bottom spacer 150 and STI layer 160 are formed using conventional fabrication techniques. For example, one or more trenches may be formed in the semiconductor substrate 110 by, for example, a wet or dry etch process. The bottom source/drain region 140 can be formed in the trenches by bottom-up epitaxial growth processes (with optional dummy vertical dielectric liners covering fin sidewalls during epitaxial growth), wherein the bottom source/drain region 140 is grown to a certain height (thickness) such as, but not necessarily limited to about 10 nm to about 50 nm. The epitaxially grown bottom source/drain region 140 can be in-situ doped, meaning dopants are incorporated into the epitaxy film during the epitaxy process. Other alternative doping techniques can be used, including but not limited to, for example, ion implantation, gas phase doping, plasma doping, plasma immersion ion implantation, cluster doping, infusion doping, liquid phase doping, solid phase doping, etc., and dopants may include, for example, an n-type dopant selected from a group of phosphorus (P), arsenic (As) and antimony (Sb), and a p-type dopant selected from a group of boron (B), gallium (Ga), indium (In), and thallium (Tl) at various concentrations. For example, in a non-limiting example, a dopant concentration range may be $1 \times 10^{18}/cm^3$ to $1 \times 10^{21}/cm^3$.

Terms such as "epitaxial growth and/or deposition" and "epitaxially formed and/or grown" refer to the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a {100} crystal surface will take on a {100} orientation. In some embodiments, epitaxial growth and/or deposition processes are selective to forming on a semiconductor surface, and do not deposit material on dielectric surfaces, such as silicon dioxide or silicon nitride surfaces.

Examples of various epitaxial growth processes include, for example, rapid thermal chemical vapor deposition (RT-CVD), low-energy plasma deposition (LEPD), ultra-high vacuum chemical vapor deposition (UHVCVD), atmospheric pressure chemical vapor deposition (APCVD) and molecular beam epitaxy (MBE). The temperature for an epitaxial deposition process can range from 500° C. to 900° C. Although higher temperature typically results in faster deposition, the faster deposition may result in crystal defects and film cracking.

A number of different sources may be used for the epitaxial growth of the compressively strained layer. In some embodiments, a gas source for the deposition of epitaxial semiconductor material includes a silicon containing gas source, a germanium containing gas source, or a combination thereof. For example, an epitaxial silicon layer may be deposited from a silicon gas source including, but not necessarily limited to, silane, disilane, ldisilane, trisilane, tetrasilane, hexachlorodisilane, tetrachlorosilane, dichlorosilane, trichlorosilane, and combinations thereof. An epitaxial germanium layer can be deposited from a germanium gas source including, but not necessarily limited to, germane, digermane, halogermane, dichlorogermane, trichlorogermane, tetrachlorogermane and combinations thereof. While an epitaxial silicon germanium alloy layer can be formed utilizing a combination of such gas sources. Carrier gases like hydrogen, nitrogen, helium and argon can be used.

The bottom/source drain region 140 is surrounded by STI layer 160. The STI layer 160 may have a height or vertical thickness (in direction Z) in the range of 50 to 400 nm. In one embodiment, a patterning process is performed by forming an etch mask (e.g., a photoresist mask) having openings which define an image of the STI layer 160, and using the etch mask to etch semiconductor substrate 110 to form trenches at a depth below the upper surface of the semiconductor substrate 110. The etch mask can be formed using any suitable patterning process including, but not limited to, a photolithography process, or a multi-patterning process. The etching can be performed using one or more sequential dry etch processes with etch chemistries that are suitable to etch the semiconductor substrate 110. The STI layer 160 is formed of any type of insulating material, such an oxide material, which is suitable for the given fabrication process flow. The insulating material (e.g., silicon oxide) can be deposited and patterned using known techniques. In some embodiments, the STI layer 160 may be formed prior to the bottom source/drain region 140 where, for example, the STI layer 160 may be patterned to form channels down to the semiconductor substrate 110 for the epitaxial growth of the bottom source/drain region 140.

The bottom spacer 150 includes, but is not necessarily limited to, silicon boron nitride (SiBN), siliconborocarbonitride (SiBCN), silicon oxycarbonitride (SiOCN), SiN or SiOx. According to an exemplary embodiment, the bottom spacer 150 is deposited using, for example, directional deposition techniques, including, but not necessarily limited to high density plasma (HDP) deposition and gas cluster ion beam (GCM) deposition. The directional deposition deposits the spacer material preferably on the exposed horizontal surfaces, but not on lateral sidewalls. Spacer material from the formation of bottom spacer 150 formed on the fin hardmask 130 can be removed using a planarization process, such as, for example, CMP.

Figure 2:
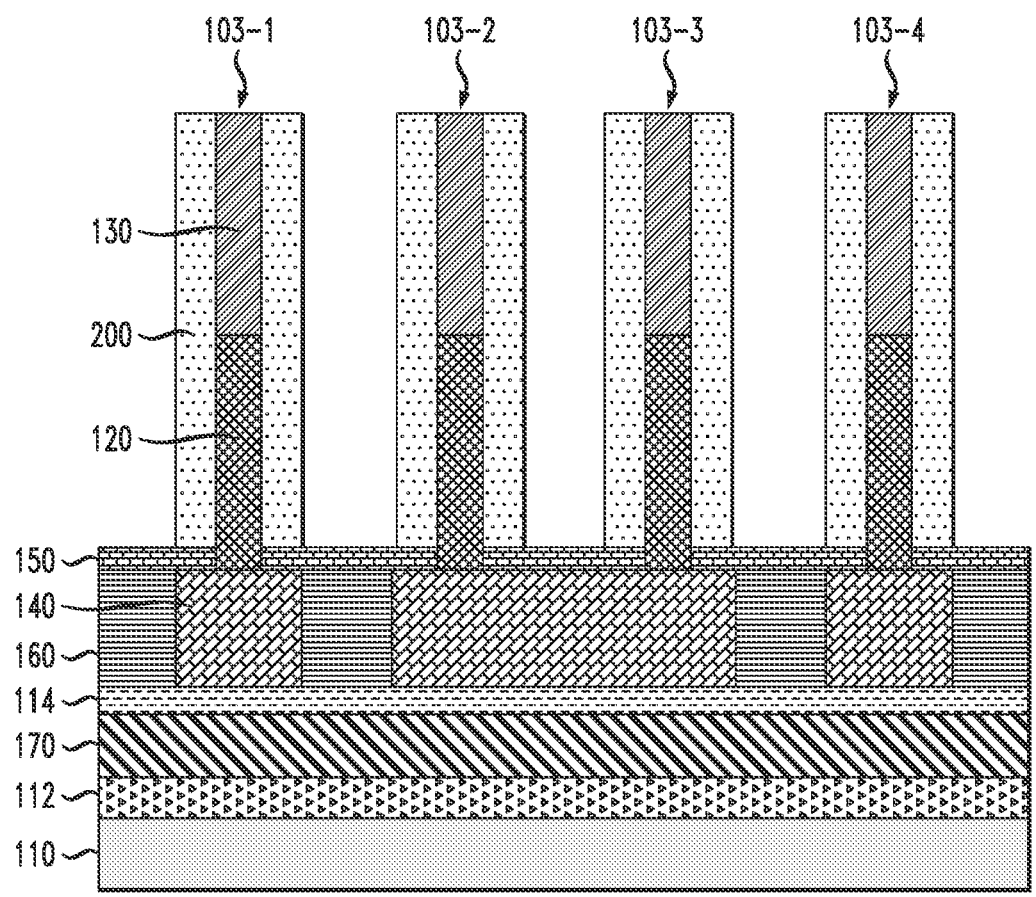
FIG. 2 is a cross-sectional view illustrating the substrate structure of FIG. 1 after the formation of sidewall spacers on the vertical surfaces of the fins and fin hardmasks of the VFET devices, according to an exemplary embodiment.

Referring now to FIG. 2, the fabrication of semiconductor structure 100 is illustrated after the formation of sacrificial sidewall spacers 200 on the vertical surfaces of the fins 120 and fin hardmasks 130 of the VFET devices 102. The sacrificial sidewall spacers 200 are formed by depositing a sacrificial layer on the fins 120, fin hardmasks 130 and on exposed surfaces of the bottom spacer 150, and portions of the sacrificial layer are removed to form sacrificial sidewall spacers 200 remaining on the vertical surfaces of each of the fins 120 and fin hardmasks 130. For example, horizontal portions of the sacrificial layer are removed in an anisotropic RIE process. The RIE process can be performed using, for example, a chlorine-based chemistry, a fluorine-based chemistry, an oxygen-based chemistry or any other chemistry. Some example chemistries include $CH_4$, $CHF_3$ and $CH_2F_2$ chemistries.

In accordance with an exemplary embodiment, the sacrificial layer comprises for example, SiC, AlOx, SiO2, SiCO, SiN, silicon boron nitride (SiBN), siliconborocarbonitride (SiBCN) or some other dielectric, and has a thickness of about 2 nm to about 10 nm.

The sacrificial layer is deposited on the fins 120, fin hardmasks 130 and on exposed surfaces of the bottom spacer 150 using, for example, deposition techniques including, but not limited to, chemical vapor deposition (CVD), plasma enhanced CVD (PECVD), radio-frequency CVD (RFCVD), physical vapor deposition (PVD), atomic layer deposition (ALD), molecular layer deposition (MLD), molecular beam deposition (MBD), pulsed laser deposition (PLD), liquid source misted chemical deposition (LSMCD), and/or sputtering.

Figure 3:
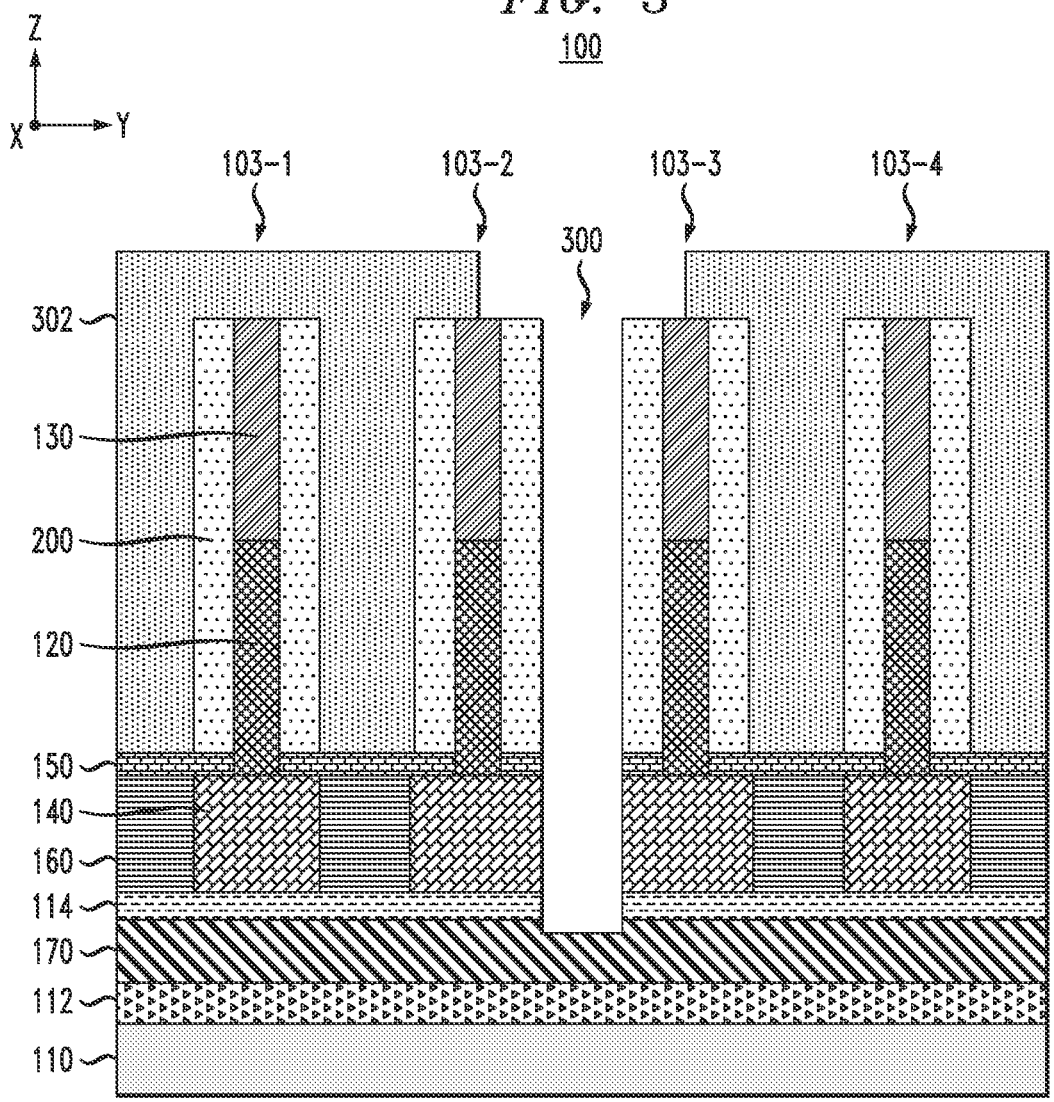
FIG. 3 is a cross-sectional view illustrating the substrate structure of FIG. 2 after the formation of a channel region between the sidewall spacers of the VFET devices, according to an exemplary embodiment.

Referring now to FIG. 3, the fabrication of semiconductor structure 100 is illustrated after the formation of a BPR opening region 300 between the sacrificial sidewall spacers 200 of FIN structures 103-2 and 103-3.

A lithographic and self-aligned etch process can be used to define the BPR opening region 300. For example, an organic planarizing layer (OPL) 302 may be coated on the semiconductor structure 100, followed by a lithographic process to define and expose the BPR opening region 300 in the OPL 302. A self-aligned etch process may be used to etch the defined portion of the OPL 302, bottom spacer 150, bottom source/drain region 140 and semiconductor substrate 114 where the etch chemistry is selective to the material of the fin hardmask 130 and sacrificial sidewall spacers 200.

The OPL 302 may comprise, for example, a resin material that is applied by spin coating and baked to enhance planarization.

With the BPR opening region 300 exposed in the OPL 302, the BPR opening region 300 is extended through the bottom spacer 150, bottom source/drain region 140 and semiconductor substrate 114 to the BPR 170, e.g., using one or more etching techniques. For example, a combination of dry or wet etching techniques may be utilized to remove the bottom spacer 150, bottom source/drain region 140 and semiconductor substrate 114 in the BPR opening region 300 and expose the BPR 170 in one or more steps. In some embodiments, directional RIE may be utilized to remove one or more of the bottom spacer 150, bottom source/drain region 140 and semiconductor substrate 114 in the BPR opening region 300 with the chemistry utilized for each layer being selective to the material of the fin hardmask 130 and sacrificial sidewall spacers 200. The RIE process can be performed using, for example, a chlorine-based chemistry, a fluorine-based chemistry, an oxygen-based chemistry or any other chemistry. Some example chemistries include $CH_4$, $CHF_3$ and $CH_2F_2$ chemistries. In some embodiments, the ME process may also etch a portion of the BPR 170. For example, in some embodiments, the ME process may not be selective to the BPR 170.

Figure 4:
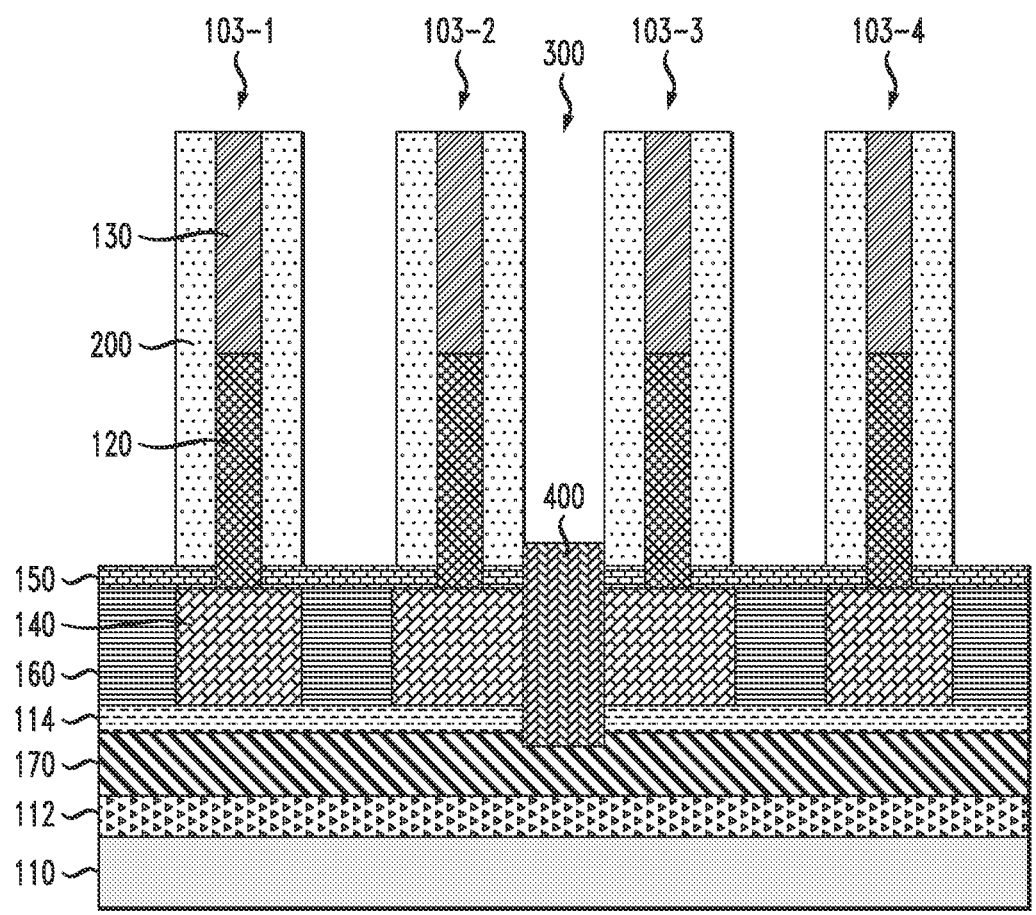
FIG. 4 is a cross-sectional view illustrating the substrate structure of FIG. 3 after the formation of a sacrificial buried contact placeholder in the channel region and the etching back of the sacrificial buried contact placeholder and resist mask, according to an exemplary embodiment.

Referring now to FIG. 4, the fabrication of semiconductor structure 100 is illustrated after the formation of a sacrificial buried contact placeholder 400 in the BPR opening region 300 and the etching back of the sacrificial buried contact placeholder 400 followed by removal of OPL 302. In some embodiments, the sacrificial buried contact placeholder 400 may be formed of a material such as, e.g., TiOx, thin Si+SiGe or other similar non-silicide materials, and the etching may be performed selective to the fin hardmask 130, sacrificial sidewall spacers 200 and bottom spacer 150. The OPL 302 may be removed by using, for example, a plasma etch process or ash process.

As seen in FIG. 4, the sacrificial buried contact placeholder 400 is etched back to a point above the bottom spacer 150 such that it extends from the BPR 170 to a height where it is in contact with at least a portion of the sacrificial sidewall spacers 200. In other embodiments, sacrificial buried contact placeholder 400 may alternatively be etched back to a height at or below the level of the bottom spacer 150.

The sacrificial buried contact placeholder 400 is utilized to temporarily fill the region in which a buried contact will be formed with a non-silicide material such that a high-K reliability anneal may be performed without degrading the region where the buried contact will be formed. For example, in this manner, the actual buried contact, which may comprise a silicide, will not be degraded by the high-K reliability anneal and instead may be formed after the performance of the high-K reliability anneal.

Figure 5:
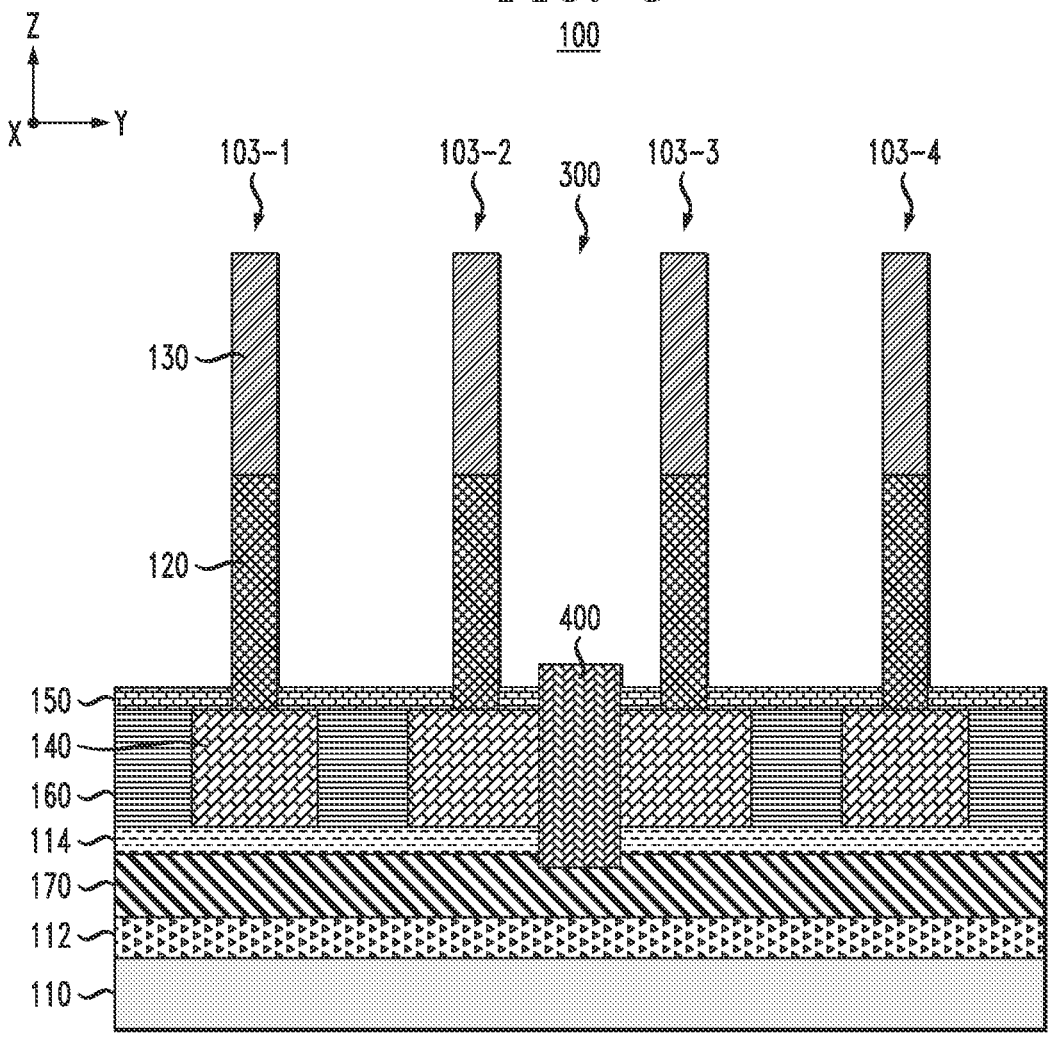
FIG. 5 is a cross-sectional view illustrating the substrate structure of FIG. 4 after the removal of the sidewall spacers, according to an exemplary embodiment.

Referring now to FIG. 5, the fabrication of semiconductor structure 100 is illustrated after the removal of the sacrificial sidewall spacers 200, for example, using a dry or wet etch process that is selective to the fin hardmasks 130, fins 120, bottom spacer 150 and sacrificial buried contact placeholder 400.

Figure 6:
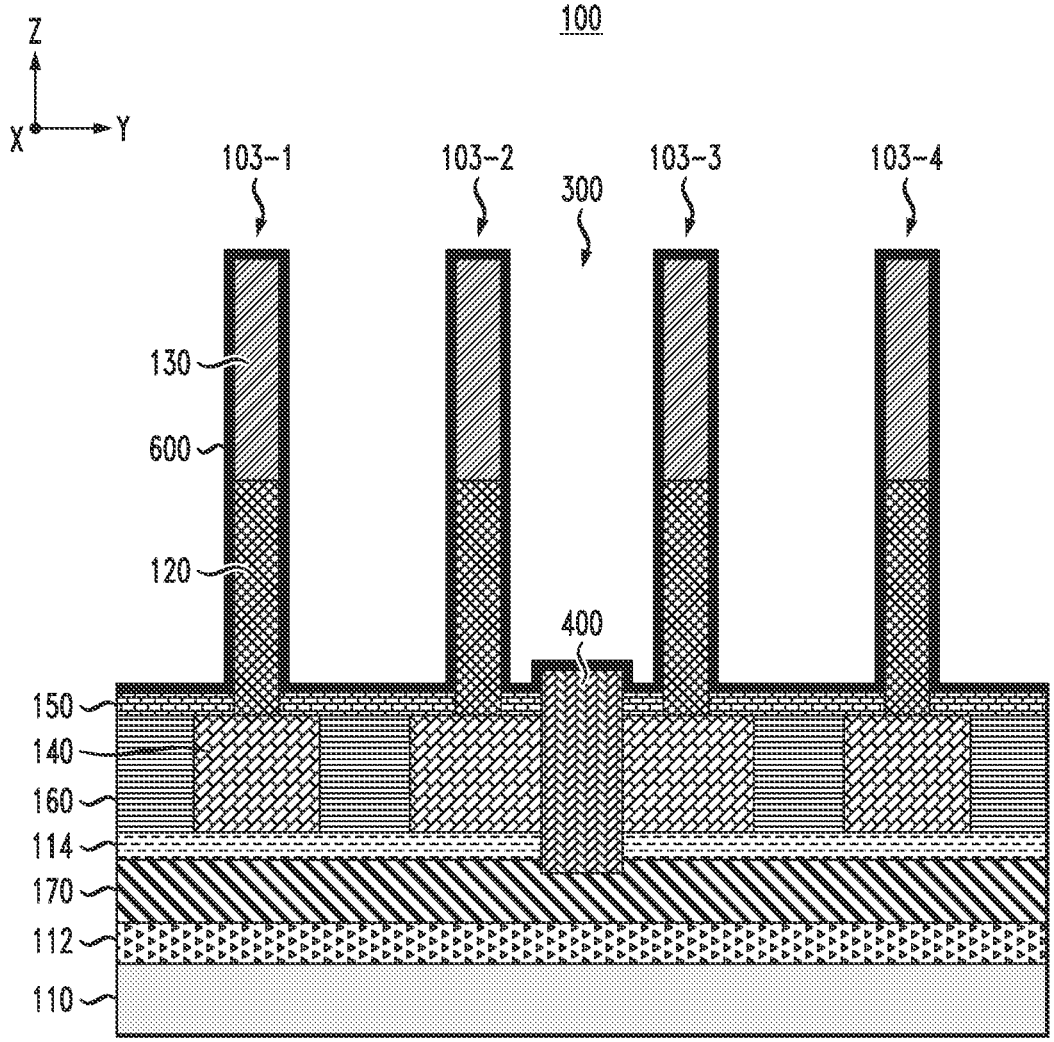
FIG. 6 is a cross-sectional view illustrating the substrate structure of FIG. 5 after the formation of a dielectric layer on and around the bottom spacer, fins and fin hardmasks, according to an exemplary embodiment.

Referring to FIG. 6, the fabrication of semiconductor structure 100 is illustrated after the formation of a dielectric layer 600 on and around the bottom spacer 150, fins 120 and fin hardmasks 130. Dielectric layer 600 may be formed of a high-k dielectric material using, e.g., a conformal deposition. Examples of high-k materials include but are not limited to metal oxides such as hafnium oxide (HfO2), hafnium silicon oxide (Hf—Si—O), hafnium silicon oxynitride (HfSiON), lanthanum oxide (La2O3), lanthanum aluminum oxide (LaAlO3), zirconium oxide (ZrO2), zirconium silicon oxide, zirconium silicon oxynitride, tantalum oxide (Ta2O5), titanium oxide (TiO2), barium strontium titanium oxide, barium titanium oxide, strontium titanium oxide, yttrium oxide (Y2O3), aluminum oxide (Al2O3), lead scandium tantalum oxide, and lead zinc niobate. The high-k material may further include dopants such as lanthanum (La), aluminum (Al), and magnesium (Mg). The dielectric layer 600 may have a uniform thickness in the range of 1 nm to 3 nm.

Figure 7:
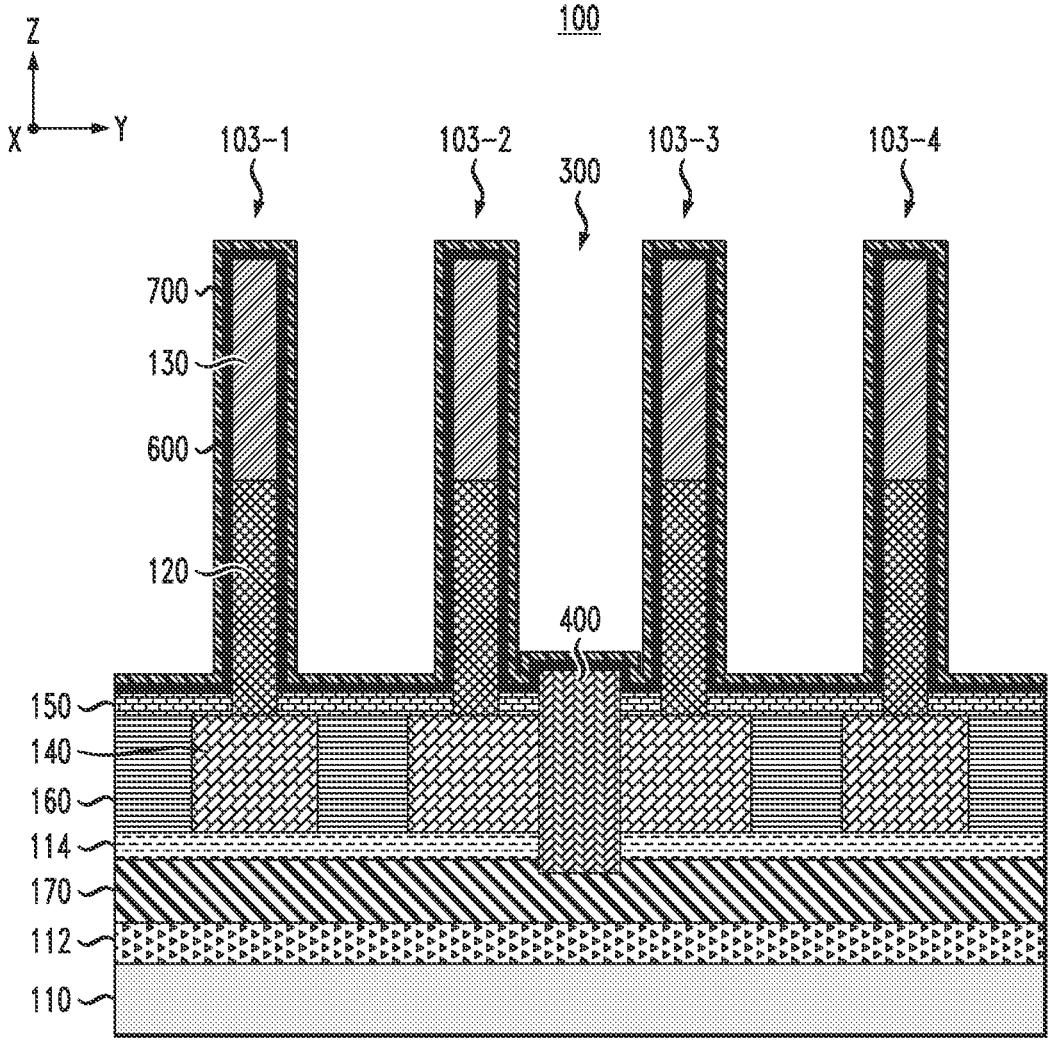
FIG. 7 is a cross-sectional view illustrating the substrate structure of FIG. 6 after the formation of a sacrificial layer on and around the dielectric layer, according to an exemplary embodiment.

Referring to FIG. 7, the fabrication of semiconductor structure 100 is illustrated after the formation of a sacrificial layer 700 on and around the dielectric layer 600. The sacrificial layer 700 may be formed, for example, using atomic layer deposition (ALD) or another suitable process and may comprise a sacrificial material including, but not necessarily limited to, titanium nitride (TiN), tantalum nitride (TaN), ruthenium (Ru), titanium aluminum nitride (TiAlN), titanium aluminum carbon nitride (TiAlCN), titanium aluminum carbide (TiAlC), tantalum aluminum carbide (TaAlC), tantalum aluminum carbon nitride (TaAlCN) or lanthanum (La) doped TiN or TaN.

Figure 8:
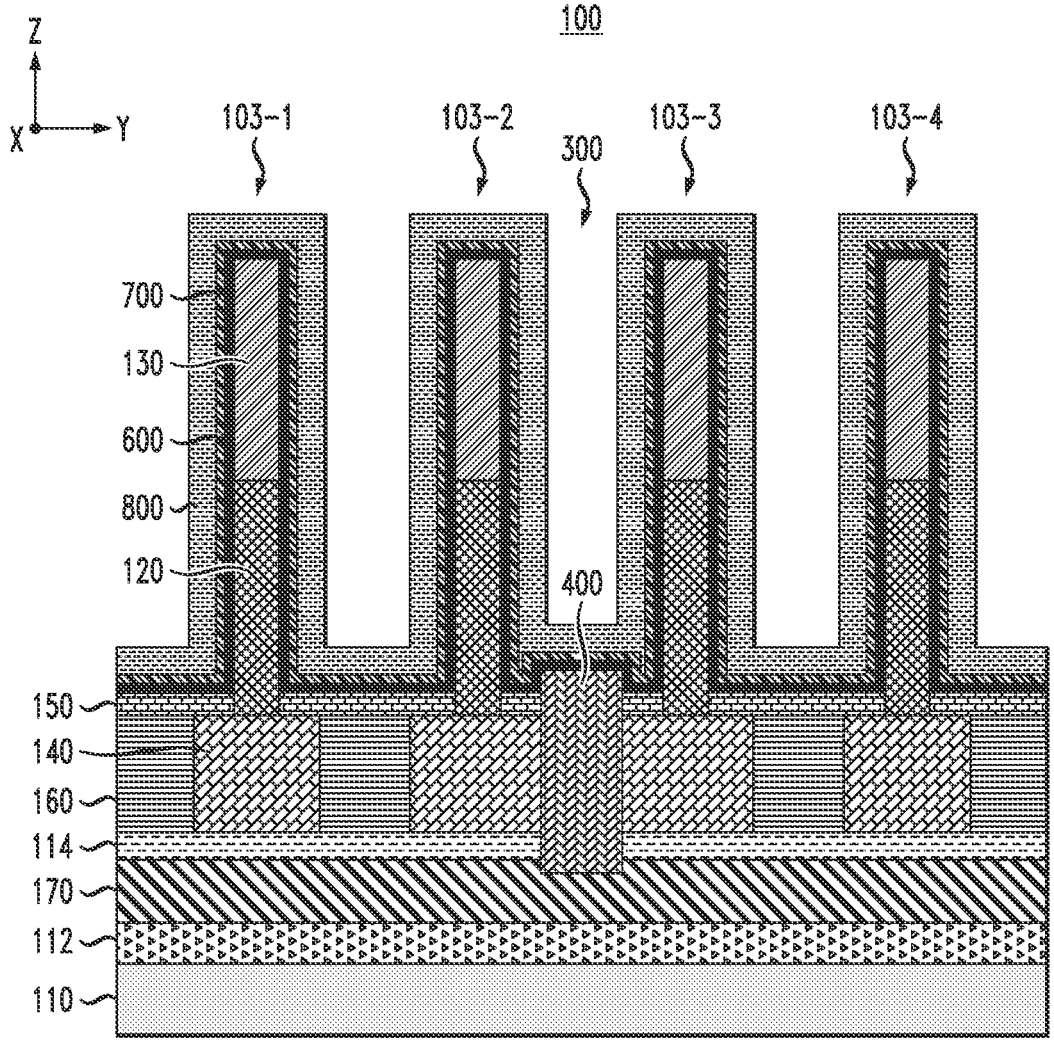
FIG. 8 is a cross-sectional view illustrating the substrate structure of FIG. 7 after the formation of another sacrificial layer on and around the sacrificial layer of FIG. 7 and the performance of a high-k reliability anneal, according to an exemplary embodiment.

Referring to FIG. 8, the fabrication of semiconductor structure 100 is illustrated after the formation of a sacrificial layer 800 on and around the sacrificial layer 700 and after the performance of a high-k reliability anneal. The sacrificial layer 800 may be formed, for example, using a blanket deposition or another suitable process and may comprise a sacrificial material such as, but not limited to an amorphous silicon (a-Si) or amorphous carbon (a-C).

Figure 9:
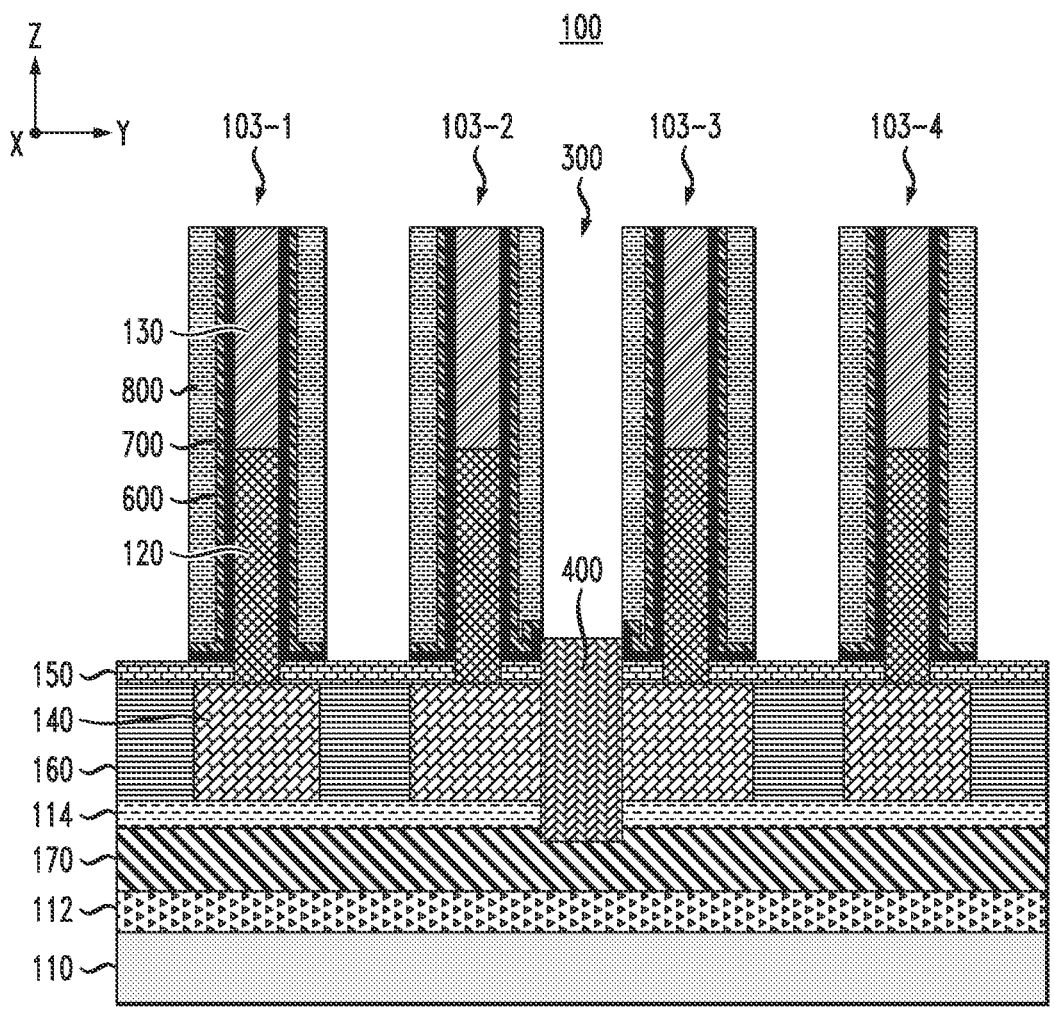
FIG. 9 is a cross-sectional view illustrating the substrate structure of FIG. 8 after an etching to expose the bottom spacer, fin hardmask and sacrificial buried contact placeholder, according to an exemplary embodiment.

Referring to FIG. 9, the fabrication of semiconductor structure 100 is illustrated after an etching to expose the bottom spacer 150, fin hardmask 130 and sacrificial buried contact placeholder 400. For example, a directional RIE may be utilized that is selective to bottom spacer 150 to etch back the dielectric layer 600, sacrificial layer 700 and sacrificial layer 800 and expose the fin hardmasks 130, bottom spacer 150 and sacrificial buried contact placeholder 400 while retaining the dielectric layer 600, sacrificial layer 700 and sacrificial layer 800 on the sidewalls of the fin 120 and fin hardmask 130.

Figure 10:
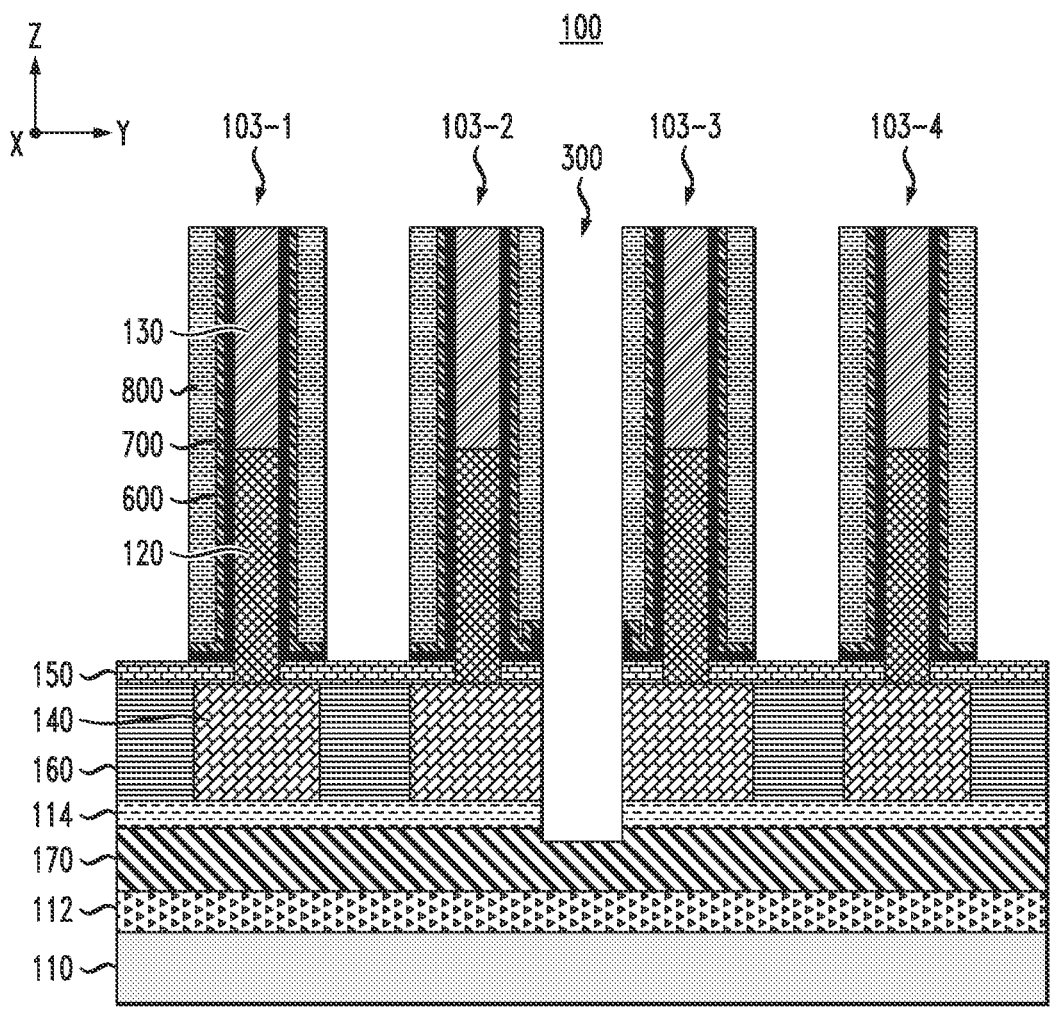
FIG. 10 is a cross-sectional view illustrating the substrate structure of FIG. 9 after the removal of the sacrificial buried contact placeholder, according to an exemplary embodiment.

Referring to FIG. 10, the fabrication of semiconductor structure 100 is illustrated after the removal of the sacrificial buried contact placeholder 400. For example, the sacrificial buried contact placeholder 400 may be removed using an isotropic etch that is selective to the BPR 170. The isotropic etch may also be selective to one or more of the fin hardmask 130, bottom spacer 150, dielectric layer 600, sacrificial layer 700 and sacrificial layer 800.

Figure 11:
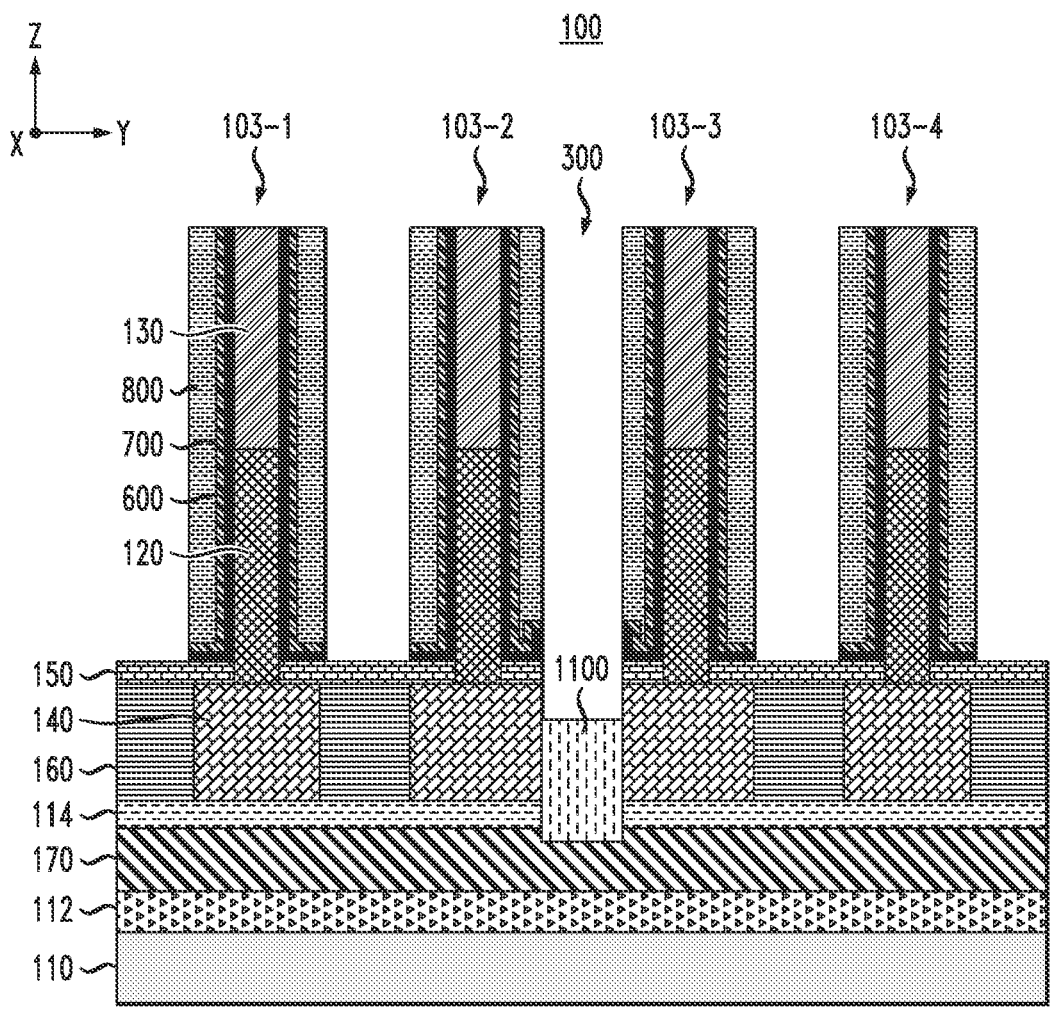
FIG. 11 is a cross-sectional view illustrating the substrate structure of FIG. 10 after the formation of a buried contact, according to an exemplary embodiment.

Referring to FIG. 11, the fabrication of semiconductor structure 100 is illustrated after the formation of a buried contact 1100. Buried contact 1100 may be formed by filling the BPR opening region 300 with a silicide metal liner, such as, e.g., Ti, Ni, NiPt, Co, followed by adhesion metal liner deposition, such as, e.g., a thin layer of TiN, TaN, followed by low resistance metal fill material including, but not necessarily limited to tungsten, cobalt, zirconium, tantalum, titanium, aluminum, ruthenium, and/or copper, using one or more deposition techniques, including, but not necessarily limited to, CVD, PECVD, PVD, ALD, MBD, PLD, LSMCD, and/or spin-on coating, followed by planarization using a planarization process, such as, for example, CMP, followed by a dry or wet process to recess the deposited metal to form the buried contact 1100. In some embodiments, the buried contact 1100 is recessed below the level of the bottom spacer 150 such that at least a portion of the bottom source/drain region 140 is exposed on either side of the BPR opening region 300.

Figure 12:
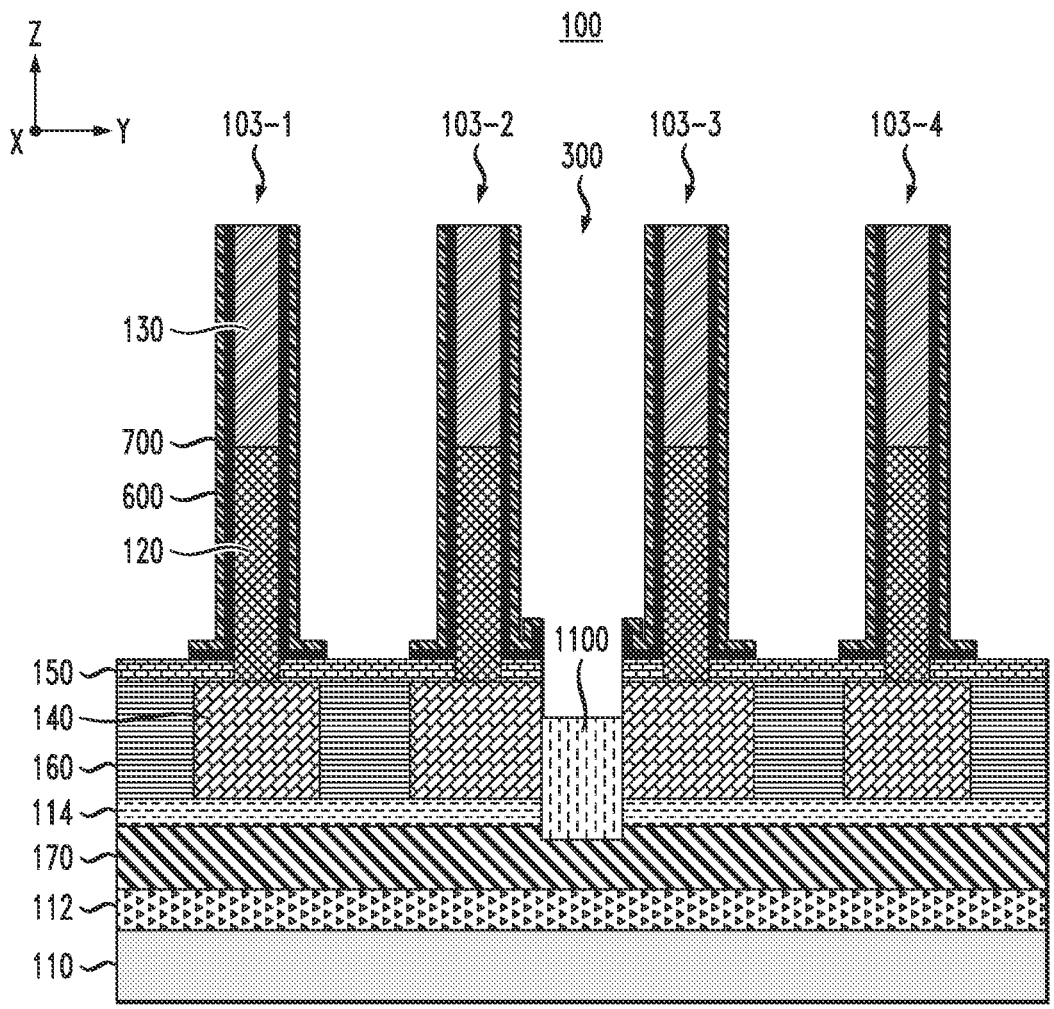
FIG. 12 is a cross-sectional view illustrating the substrate structure of FIG. 11 after the sacrificial layer of FIG. 8 is removed, according to an exemplary embodiment.

Referring to FIG. 12, the fabrication of semiconductor structure 100 is illustrated after the sacrificial layer 800 is removed, for example, using an RIE process that is selective to the sacrificial layer 700, bottom spacer 150, and buried contact 1100.

Figure 13:
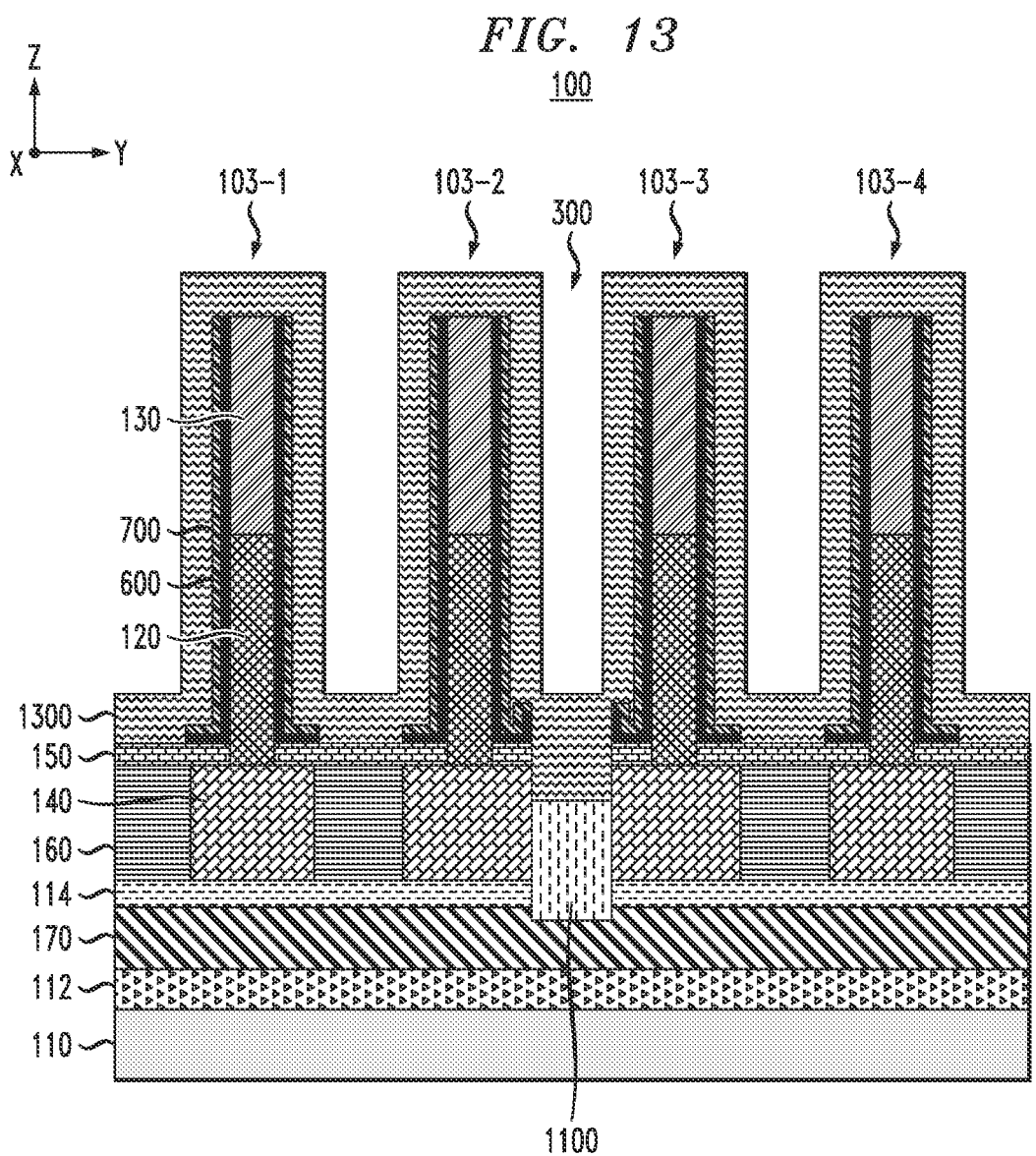
FIG. 13 is a cross-sectional view illustrating the substrate structure of FIG. 12 after the formation of a capping layer, according to an exemplary embodiment.

Referring to FIG. 13, the fabrication of semiconductor structure 100 is illustrated after the formation of a capping layer 1300, e.g., using ALD or another suitable process. The capping layer 1300 may comprise, for example, an insulating material such as silicon dioxide (SiO2), SiN, silicon oxycarbide (SiOC), etc.

Figure 14:
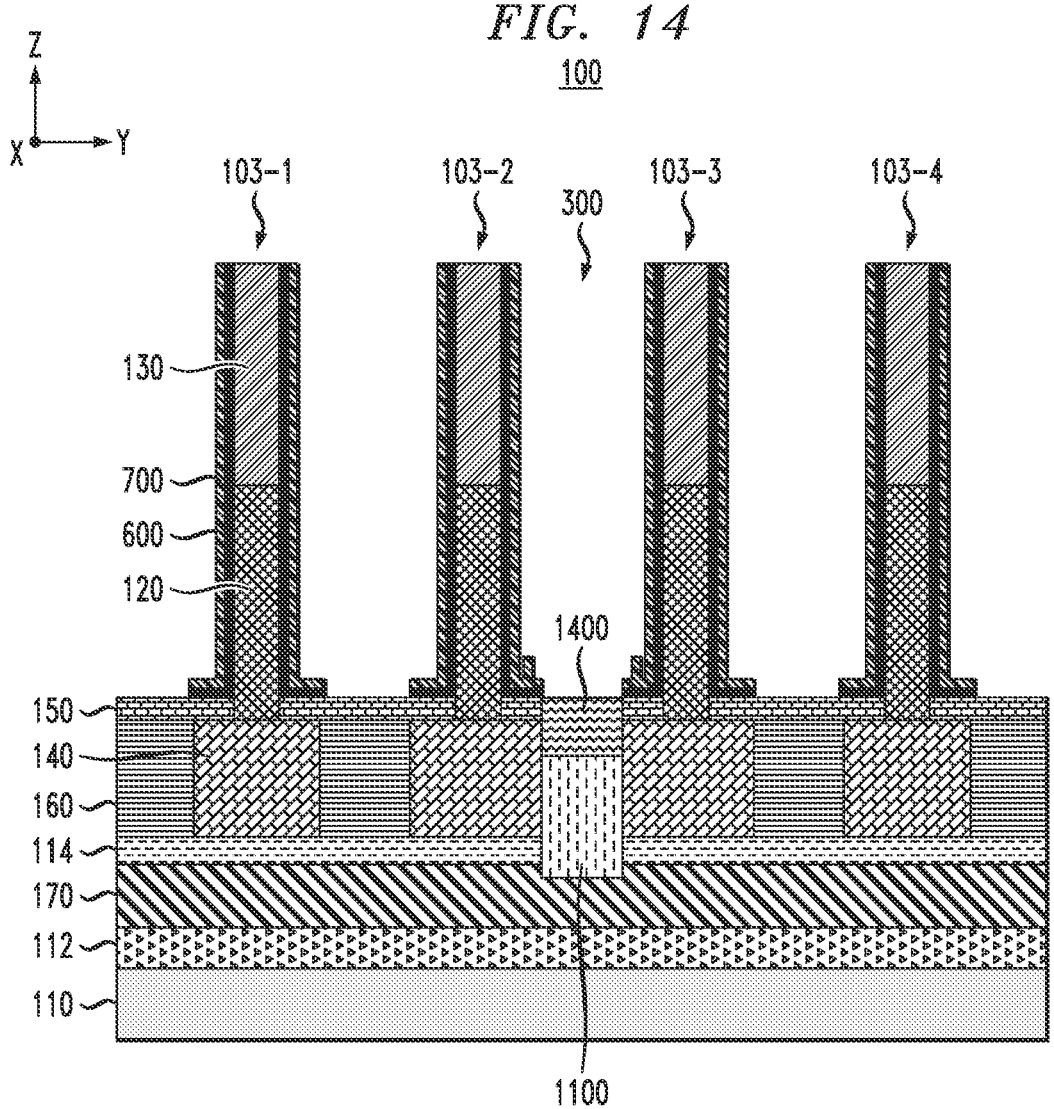
FIG. 14 is a cross-sectional view illustrating the substrate structure of FIG. 13 after the capping layer is etched back to form a buried contact cap, according to an exemplary embodiment.

Referring to FIG. 14, the fabrication of semiconductor structure 100 is illustrated after the capping layer 1300 is etched back to form buried contact cap 1400, e.g., using an isotropic etch or another suitable process. In some embodiments, the buried contact cap 1400 is in contact with the bottom spacer 150 and at least a portion of the buried contact cap 1400 is higher in the semiconductor structure 100 than the STI layer 160, e.g., in the Z direction. In some embodiments, at least a portion of the buried contact cap 1400 is higher in the semiconductor structure 100 than the bottom source/drain region 140.

Figure 15:
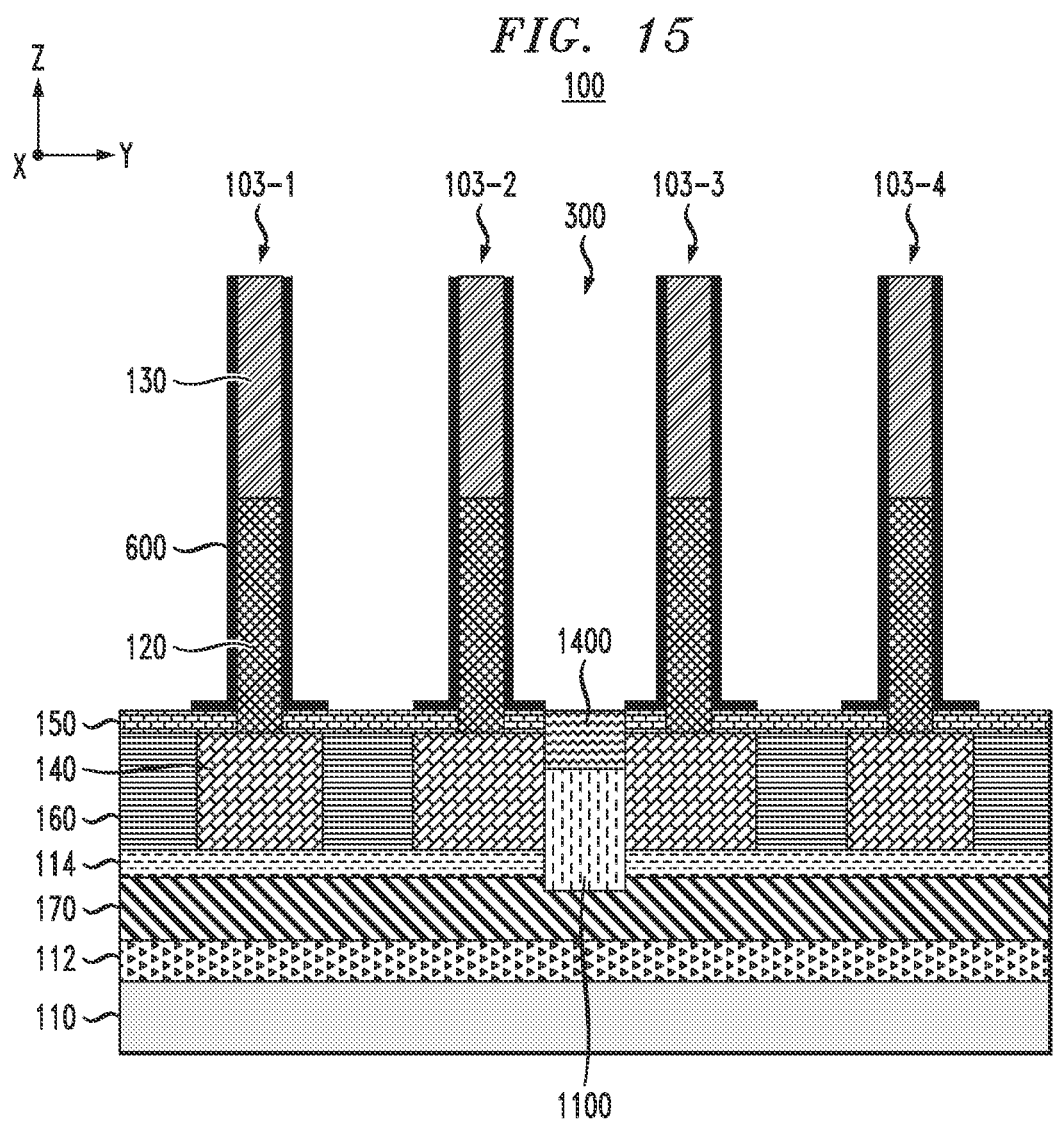
FIG. 15 is a cross-sectional view illustrating the substrate structure of FIG. 14 after the sacrificial layer of FIG. 7 is removed, according to an exemplary embodiment.

Referring to FIG. 15, the fabrication of semiconductor structure 100 is illustrated after the sacrificial layer 700 is removed. In one embodiment, the sacrificial layer 700 is removed using an isotropic wet etch process with an etch chemistry that is configured to etch away the sacrificial layer 700 selective to the surrounding materials such as the dielectric layer. For example, in an exemplary embodiment wherein the sacrificial layer 700 comprises TiN, a wet etch solution such as, but not limited to, SC1 (NH4/H2O2/H2O=1:2:5) or SPM (H2SO4/H2O2=10:1) can be utilized to isotropically etch away the sacrificial layer 700 selective to the dielectric material 600.

Figure 16:
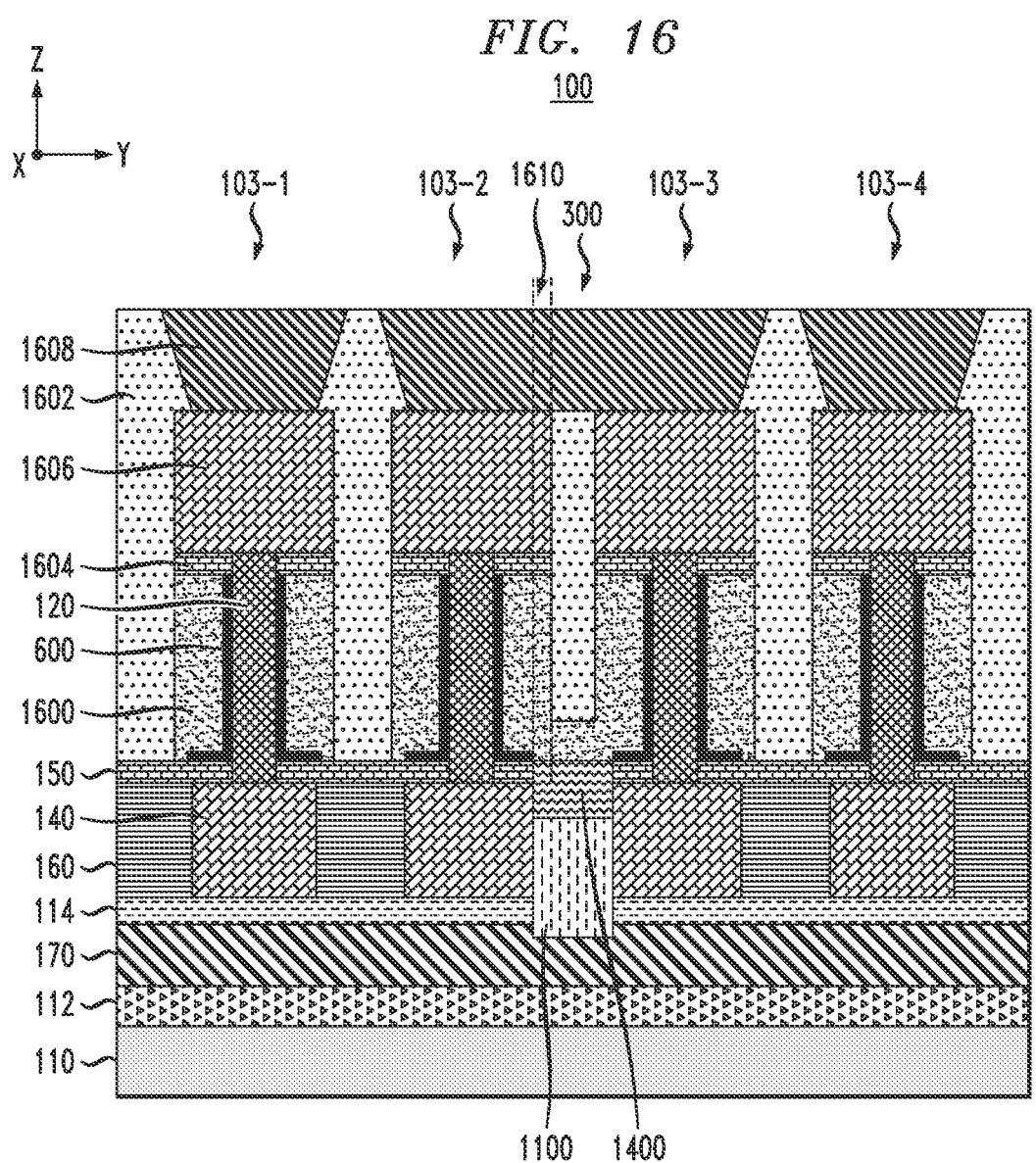
FIG. 16 is a cross-sectional view illustrating the substrate structure of FIG. 15 after the formation of gate metal layers, top spacers and an inter-level dielectric (ILD), the removal of fin hardmasks, and the formation of top source/drain regions and top source/drain contacts, according to an exemplary embodiment.

Referring to FIG. 16, the fabrication of semiconductor structure 100 is illustrated after the formation of gate metal layers 1600, an inter-level dielectric (ILD) 1602 and top spacers 1604, the removal of fin hardmasks 130, and the formation of top source/drain regions 1606 and contact material 1608.

Gate metal layers 1600 are formed on dielectric layer 600 and portions of bottom spacer 150. The gate metal layers 1600 are deposited on the dielectric layer 600 and bottom spacer 150 and include, for example, a work function metal such as, for example, TiN, TiC, TiAl, TiAlC, TaN, etc., and a low resistance metal, such as, for example, tungsten, cobalt, zirconium, tantalum, titanium, aluminum, ruthenium, copper, metal carbides, metal nitrides, transition metal aluminides, tantalum carbide, titanium carbide, tantalum magnesium carbide, or combinations thereof. In some embodiments, lithographic or other patterning may be utilized to pattern the locations of the gate metal layers 1600 such that unwanted gate metals are removed. In some embodiments, for example, the gate metal layer 1600 may be formed such that it extends between FIN structures 103-2 and 103-3 of the two-fin VFET device 102-2 over the buried contact cap 1400. In some embodiments, the gate metal layer 1600 is formed in contact with the buried contact cap 1400.

The gate metal layers 1600 are deposited using, for example, deposition techniques including, but not limited to, CVD, PECVD, RFCVD, PVD, ALD, MLD, MBD, PLD, LSMCD, sputtering, and/or plating. A lithographic mask is formed to define the gate regions, including the gate contact landing region (not shown) and shared gate region for VFET devices with more than two fin structures. An anisotropic etch is utilized to etch away any unwanted gate structure material such that, for example, any gate metal that is not next to the fin structures 103 or protected by the lithographic mask are etched away. In such an embodiment, at least a portion of the gate metal layers 1600 of FIN structures 103-2 and 103-3 overlap the buried contact cap 1400, e.g., in the Z-direction.

A dielectric material, including, but not limited to $SiO_x$, low temperature oxide (LTO), high temperature oxide (HTO), flowable oxide (FOX) or some other dielectric, is deposited to form an ILD 1602 on the recessed gate structures. The ILD 1602 can be deposited using deposition techniques including, but not limited to, CVD, PECVD, RFCVD, PVD, ALD, MLD, MBD, PLD, and/or LSMCD, sputtering, and/or plating. Planarization, for example, chemical mechanical polishing (CMP) can be performed to remove excess material from ILD 1602 and planarize the resulting structure. The planarization can be performed down to the fin hardmasks 130 on the fins 120 such that the FIN hardmasks 130 are exposed. In accordance with an exemplary embodiment, the ILD 1602 electrically isolates the different FIN structures 103 from each other.

The fin hardmasks 130 are selectively removed, using for example, a selective etch process. The selective etch process can include, for example, fluorinated gas (such as $SF_6$, $CH_4$, or $CHF_3$) based dry etching or hot phosphoric acid ($H_3PO_4$) etching. Then, upper portions of the ILD 1602 are removed using, for example, another selective etching process, such as a selective oxide etch using, for example, $F/NH_3$ based dry etching. The removal of the upper portions of the ILD 1602 exposes upper portions of the fins 120 so that a top spacer 1604 can be formed and top source/drain regions 1606 can be epitaxially grown.

Top spacer 1604 is formed on the recessed gate structure, including the gate metal 1600 and dielectric layer 160 and on and around the fins 120 including the fin hardmasks 130 thereon. The top spacer 1604 includes, for example, SiN, SiBN, SiBCN, SiOCN or other dielectric materials. In some embodiments, the top spacer 1604 is conformally deposited using, for example, deposition techniques including, but not limited to, CVD, PECVD, RFCVD, PVD, ALD, MLD, MBD, PLD, LSMCD, sputtering, and/or plating.

The top source/drain regions 1606 are epitaxially grown in epitaxial growth processes from the upper portions of the fins 120. The epitaxially grown top source/drain regions 1606 can be in-situ doped. Other alternative doping techniques can be used, including but not limited to, for example, ion implantation, gas phase doping, plasma doping, plasma immersion ion implantation, cluster doping, infusion doping, liquid phase doping, solid phase doping, etc., and dopants may include, for example, an n-type dopant selected from a group of P, As and Sb, and a p-type dopant selected from a group of B, Ga, In, and Tl at various concentrations. For example, in a non-limiting example, a dopant concentration range may be $1 \times 10^{18}/cm^3$ to $1 \times 10^{21}/cm^3$.

Following top source/drain region 1606 formation, ILD material is again deposited to form the remainder of the ILD 1602 over the top source/drain regions 1606 and to fill in gaps between the top source/drain regions 1606. The ILD material is deposited using, for example, deposition techniques including, but not limited to, CVD, PECVD, RFCVD, PVD, ALD, MLD, MBD, PLD, LSMCD, sputtering, and/or plating, followed by a planarization process, such as, for example, CMP.

Contact trenches or vias are respectively opened in the ILD 1602 over the top source/drain regions 1606 using, for example, lithography followed by an RIE process to etch the contact trenches down to the top source/drain regions 1606. Contact material 1608 is formed on the top source/drain regions 1606 in the contact trenches, for example, by depositing a silicide metal liner such as, e.g., Ti, Ni, NiPt or other similar materials in the contact trenches, depositing an adhesion layer on the silicide metal liner such as, e.g., TiN, and depositing a low resistance metal-based material such as, e.g., tungsten, cobalt, aluminum, ruthenium and/or copper. Deposition of the contact material 1608 can be performed using one or more deposition techniques, including, but not necessarily limited to, CVD, PECVD, PVD, ALD, MBD, PLD, LSMCD, and/or spin-on coating, followed by planarization using a planarization process, such as, for example, CMP.

According to the above fabrication process in this embodiment, a buried contact 1100 may be formed for connecting the bottom source/drain regions 140 to the BPR 170 without silicide degradation due to a high-K reliability anneal process, e.g., through the use of the sacrificial buried contact placeholder 400 preserve the location where the buried contact 1100 will be formed during the high-K reliability anneal process as shown and described with reference to FIGS. 4-9.

As seen in FIG. 16, in an embodiment, the upper surface of the buried contact cap 1400 is higher than the STI layer 160 in the z-direction, also referred to as the vertical direction or first direction herein. In an embodiment, the gate metal layer 1600 of the VFET device 102-2 with FIN structures 103-2 and 103-3 at least partially overlaps the buried contact cap 1400 in the z-direction, e.g., as seen in the region 1610 defined by the pair of dashed lines. For example, at least a portion of the top source/drain region 1606, top spacer 1604 and gate metal layer 1600 of each of FIN structures 103-2 and 103-3 overlap at least a portion of the buried contact cap 1400 and buried contact 1100 in the embodiment shown in FIG. 16. In some embodiments, as also shown in FIG. 16, the dielectric layer 600 of FIN structures 103-2 and 103-3 do not overlap with the buried contact cap 1400 in the z-direction.

Although illustrative embodiments have been described herein with reference to the accompanying drawings, it is to be understood that the invention is not limited to those precise embodiments, and that various other changes and modifications may be made by one skilled in the art without departing from the scope or spirit of the invention.

We claim:

1. A semiconductor structure comprising:
   a power rail contact at least partially disposed between opposing sidewalls of a first source/drain region of a first vertical fin structure and a second source/drain region of a second vertical fin structure, wherein a top surface of the power rail contact is below a top surface of the first source/drain region and the second source/drain region, and a bottom surface of the power rail contact is below a bottom surface of the first source/drain region and the second source/drain region;
   a buried power rail disposed under the first and second vertical fin structures, and on the bottom surface of the power rail contact; and
   a contact cap disposed above the power rail contact;
   wherein the first vertical fin structure comprises a metal-based gate layer disposed above the first source/drain region and in contact with a top surface of the contact cap; and wherein the first vertical fin structure and the second vertical fin structure together form a single vertical field-effect transistor and comprise the metal-based gate layer.

2. The semiconductor structure of claim 1 further comprising an insulative layer disposed around at least a portion of each of the first and second source/drain regions, an upper surface of the contact cap being non-coplanar with an upper surface of the insulative layer.

3. The semiconductor structure of claim 2 wherein the upper surface of the contact cap is higher than the upper surface of the insulative layer in a fin direction, the fin direction being a direction in which the first and second vertical fin structures extend.

4. The semiconductor structure of claim 3 wherein at least a portion of the contact cap is higher than the first and second source/drain regions in the fin direction.

5. The semiconductor structure of claim 1 wherein:
the first vertical fin structure comprises a fin extending from the first source/drain region and an insulative layer disposed between the fin and the metal-based gate layer; and
the insulative layer does not overlay the contact cap.

6. The semiconductor structure of claim 1 wherein the power rail contact is formed of a silicide material.

7. The semiconductor structure of claim 1, wherein the metal-based gate layer is further disposed on sidewalls of the first vertical fin structure and the second vertical fin structure.

8. The semiconductor structure of claim 7, further comprising a third source/drain region disposed over the first vertical fin structure and a fourth source/drain region disposed over the second vertical fin structure.

9. The semiconductor structure of claim 8, further comprising a source/drain contact disposed over the third source/drain region and the fourth source/drain region.

10. A semiconductor device comprising:
a first vertical fin structure comprising a first source/drain region;
a second vertical fin structure comprising a second source/drain region;
a buried power rail disposed under the first and second vertical fin structures and below the first and second source/drain regions;
a power rail contact at least partially disposed between opposing sidewalls of the first and second source/drain regions and in contact with the buried power rail, the power rail contact being in contact with at least one of the first and second source/drain regions, wherein a top surface of the power rail contact is below a top surface of the first source/drain region and the second source/drain region, and a bottom surface of the power rail contact is below a bottom surface of the first and second source/drain regions; and
a contact cap disposed above the power rail contact;
wherein the first vertical fin structure comprises a metal-based gate layer disposed above the first source/drain region and in contact with a top surface of the contact cap; and
wherein the first vertical fin structure and the second vertical fin structure together form a single vertical field-effect transistor and comprise the metal-based gate layer.

11. The semiconductor device of claim 10 wherein the semiconductor device comprises an insulative layer disposed around at least a portion of each of the first and second source/drain regions, an upper surface of the contact cap being non-coplanar with an upper surface of the insulative layer.

12. The semiconductor device of claim 11 wherein the upper surface of the contact cap is higher than the upper surface of the insulative layer in a fin direction, the fin direction being a direction in which the first and second vertical fin structures extend.

13. The semiconductor device of claim 12 wherein at least a portion of the contact cap is higher than the first and second source/drain regions in the fin direction.

14. The semiconductor device of claim 10 wherein:
the first vertical fin structure comprises a fin extending from the first source/drain region and an insulative layer disposed between the fin and the metal-based gate layer; and
the insulative layer does not overlay the contact cap.

15. The semiconductor device of claim 10 wherein the power rail contact is formed of a silicide material.

16. The semiconductor device of claim 10, wherein the metal-based gate layer is further disposed on sidewalls of the first vertical fin structure and the second vertical fin structure.

17. The semiconductor device of claim 16, further comprising a third source/drain region disposed over the first vertical fin structure and a fourth source/drain region disposed over the second vertical fin structure.

18. The semiconductor device of claim 17, further comprising a source/drain contact disposed over the third source/drain region and the fourth source/drain region.

19. An integrated circuit, comprising:
one or more semiconductor structures, wherein at least one of the one or more semiconductor structures comprises:
a power rail contact at least partially disposed between opposing sidewalls of a first source/drain region of a first vertical fin structure and a second source/drain region of a second vertical fin structure, wherein a top surface of the power rail contact is below a top surface of the first source/drain region and the second source/drain region, and a bottom surface of the power rail contact is below a bottom surface of the first source/drain region and the second source/drain region;
a buried power rail disposed under the first and second vertical fin structures, and on the bottom surface of the power rail contact; and
a contact cap disposed above the power rail contact;
wherein the first vertical fin structure comprises a metal-based gate layer disposed above the first source/drain region and in contact with a top surface of the contact cap; and
wherein the first vertical fin structure and the second vertical fin structure together form a single vertical field-effect transistor and comprise the metal-based gate layer.

20. The integrated circuit of claim 19 wherein the at least one of the one or more semiconductor structures comprises an insulative layer disposed around at least a portion of each of the first and second source/drain regions, an upper surface of the contact cap being non-coplanar with an upper surface of the insulative layer.

* * * * *